US012695465B2

(12) United States Patent
Lester et al.

(10) Patent No.: US 12,695,465 B2
(45) Date of Patent: Jul. 28, 2026

(54) SELECTION OF REDUCTION OPERATION IN A STORAGE SYSTEM

(71) Applicant: HEWLETT PACKARD ENTERPRISE DEVELOPMENT LP, Spring, TX (US)

(72) Inventors: Robert Michael Lester, Colorado Springs, CO (US); Matthew S. Gates, Houston, TX (US); Alex Veprinsky, San Jose, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/326,392

(22) Filed: May 31, 2023

(65) Prior Publication Data

US 2024/0405783 A1 Dec. 5, 2024

(51) Int. Cl.
*H03M 7/30* (2006.01)
*H03M 7/42* (2006.01)

(52) U.S. Cl.
CPC ........... *H03M 7/3091* (2013.01); *H03M 7/42* (2013.01)

(58) Field of Classification Search
CPC .... H03M 7/3091; H03M 7/42; H03M 7/3059; H03M 7/60
See application file for complete search history.

(56) References Cited

U.S. PATENT DOCUMENTS

| | | | |
|---|---|---|---|
| 8,849,898 B2 | 9/2014 | Tofano | |
| 10,229,269 B1 * | 3/2019 | Patton | G06F 21/554 |
| 10,509,676 B1 * | 12/2019 | Bassov | G06F 3/064 |
| 10,664,165 B1 * | 5/2020 | Faibish | G06F 3/0638 |
| 11,232,075 B2 | 1/2022 | Bassov et al. | |
| 2012/0150954 A1 | 6/2012 | Tofano | |
| 2014/0244604 A1 | 8/2014 | Oltean et al. | |
| 2014/0351229 A1 * | 11/2014 | Gupta | H03M 7/607 |
| | | | 707/693 |
| 2019/0042734 A1 | 2/2019 | Kounavis et al. | |
| 2020/0134049 A1 | 4/2020 | Bassov et al. | |
| 2020/0264778 A1 * | 8/2020 | Yang | G06F 3/064 |
| 2020/0341667 A1 | 10/2020 | Bassov et al. | |
| 2021/0011894 A1 * | 1/2021 | Faibish | H03M 7/3091 |

(Continued)

FOREIGN PATENT DOCUMENTS

| | | |
|---|---|---|
| CN | 109993008 A | 7/2019 |
| CN | 112181919 A | 1/2021 |

OTHER PUBLICATIONS

Github, "Zstandard—Real-time data compression algorithm" available online at <https://facebook.github.io/zstd/>, retrieved from internet on Jun. 12, 2023, 12 pages.

(Continued)

*Primary Examiner* — Rocio Del Mar Perez-Velez
(74) *Attorney, Agent, or Firm* — Trop, Pruner & Hu, P.C.

(57) ABSTRACT

Example implementations relate to storing data in a storage system. An example includes receiving, by a storage controller of a storage system, a data unit to be stored in persistent storage of the storage system. The storage controller calculates multiple entropy values for the data unit. The storage controller selects, based on the multiple entropy values, at least one reduction operation from multiple different reduction operations. The storage controller performs the selected at least one reduction operation on the received data unit.

20 Claims, 9 Drawing Sheets

(56)　　　　　References Cited

U.S. PATENT DOCUMENTS

| | | | | |
|---|---|---|---|---|
| 2023/0087778 | A1* | 3/2023 | Borzov | G06F 16/152 |
| | | | | 707/692 |
| 2024/0296122 | A1* | 9/2024 | Milburn | G06F 12/1009 |
| 2025/0139058 | A1* | 5/2025 | Singh | G06F 16/1748 |

OTHER PUBLICATIONS

John, "Rényi Entropy", available online at <https://www.johndcook.com/blog/2018/11/21/renyi-entropy/>, Nov. 21, 2018, 6 pages.
Kranz et al., "data deduplication", available online at <https://web.archive.org/web/20220421094436/https://www.techtarget.com/searchstorage/definition/data-deduplication>, Apr. 21, 2022, 4 pages.
Wikipedia, "LZ4 (compression algorithm)", available online at <https://en.wikipedia.org/wiki/LZ4_(compression_algorithm)>, May 30, 2023, 3 pages.
"Data Compression Corpora", available online at <http://www.data-compression.info/Corpora/index.html>, 2022, 2 pages.
Balakrishnan et al., "Relationship Between Entropy and Test Data Compression," Feb. 2007, IEEE Transactions On Computer-Aided Design of Integrated Circuits and Systems, vol. 26, No. 2, pp. 386-395.
Dell, "Dell EMC Unity: Compression ", Mar. 2018, 39 Pages.
Ebeling et al., "Entropy and Compressibility of Symbol Sequences," Feb. 23, 1997, PhysComp96, 5pgs.
Hewlett-Packard Development Company, L.P., "HP StoreOnce Backup systems, G3 BBxxxA models Best practices for VTL, NAS, StoreOnce Catalyst and Replication implementations," Mar. 2013, <https://community.microfocus.com/cfs-file/_key/telligent-evolution-components-attachments/00-208-01-00-01-37-19-32/Best-Practices-for-VTL_2C00_-NAS_2C00_-StoreOnce-Catalyst.pdf>, 164 pages.
M4rt1n et al., "Compression makes some files bigger," Nov. 2019, Cloudflare Community, <https://community.cloudflare.com/t/compression-makes-some-files-bigger/129229>, 16 pages.
Wikipedia, "Hartley function," May 25, 2023, <https://en.wikipedia.org/w/index.php?title=Hartley_function&oldid=1157012225>, 3 pages.
Wikipedia, "Entropy (information theory)," May 18, 2023, <https://en.wikipedia.org/w/index.php?title=Entropy_(information_theory)&oldid=1155513435>, 18 pages.
Claude E. Shannon, "A Mathematical Theory of Communication," Oct. 1948, Bell System Technical Journal, vol. 27, No. 4, pp. 623-656.
Hewlett Packard Enterprise Development LP, "HPE 3PAR Thin Technologies," Nov. 2016, doc. 4AA3-8987ENW, Rev. 10, 54 pages.

* cited by examiner

| Data Reduction Logic 120 |
|---|
| Deduplication Logic 122 |
| Compression Logic 126 |

| Index | Constant |
|---|---|
| 0 | 0.000000 |
| 1 | 0.000000 |
| 2 | 1.000000 |
| 3 | 1.584963 |
| ⋮ | ⋮ |
| 256 | 8.000000 |

FIG. 2A          └─ LUT 135

| Threshold | Value |
|---|---|
| Second Upper (UT2) | 7.5 |
| First Upper (UT1) | 6.0 |
| Third (T3) | 5.5 |
| Second Lower (LT2) | 5.0 |
| First Lower (LT1) | 4.0 |

FIG. 2B          └─ Thresholds 137

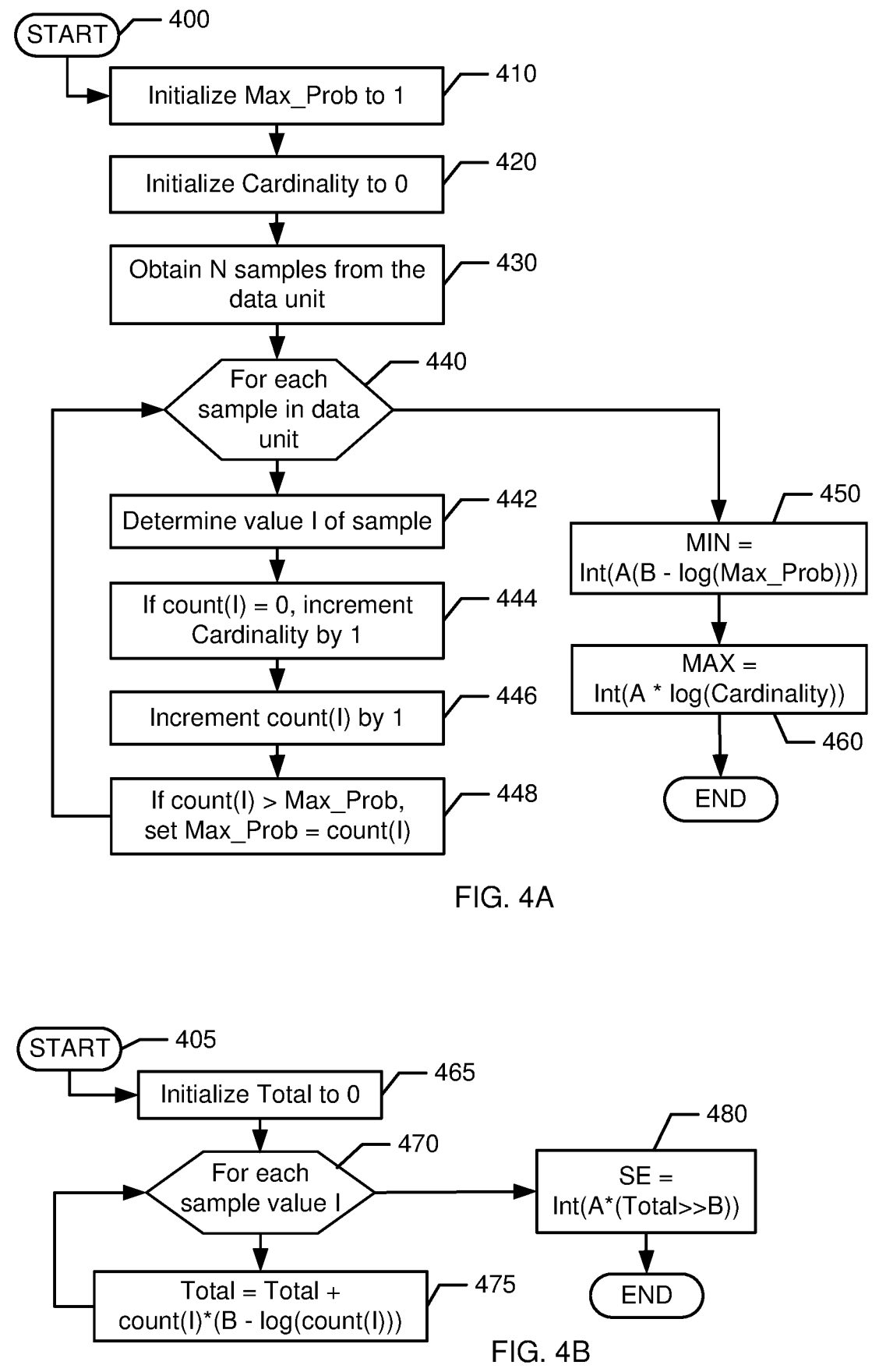

START — 400

Initialize Max_Prob to 1 — 410

Initialize Cardinality to 0 — 420

Obtain N samples from the data unit — 430

For each sample in data unit — 440

Determine value I of sample — 442

If count(I) = 0, increment Cardinality by 1 — 444

Increment count(I) by 1 — 446

If count(I) > Max_Prob, set Max_Prob = count(I) — 448

MIN = Int(A(B - log(Max_Prob))) — 450

MAX = Int(A * log(Cardinality)) — 460

END

FIG. 4A

START — 405

Initialize Total to 0 — 465

For each sample value I — 470

Total = Total + count(I)*(B - log(count(I))) — 475

SE = Int(A*(Total>>B)) — 480

END

FIG. 4B

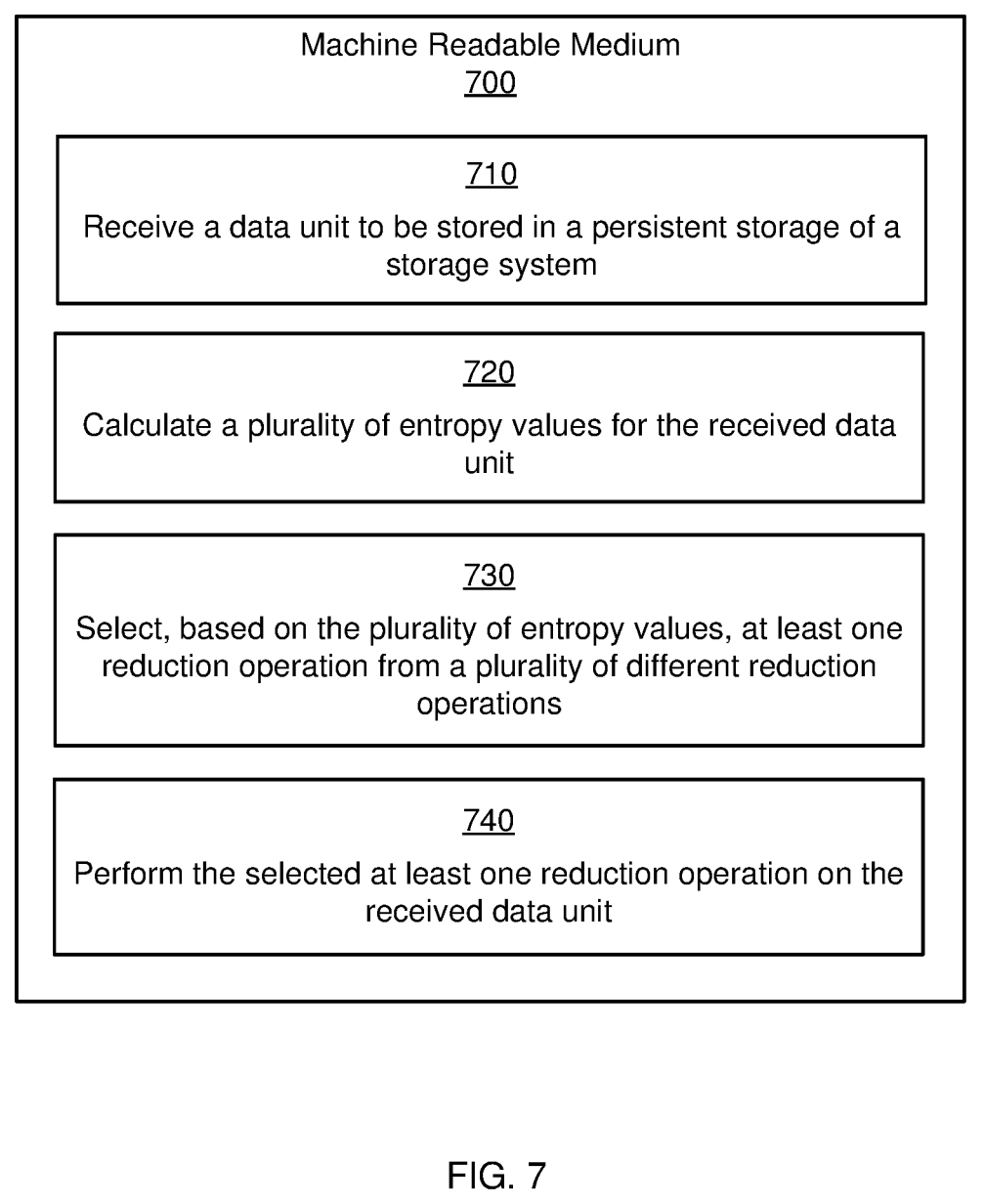

Machine Readable Medium
700

710

Receive a data unit to be stored in a persistent storage of a storage system

720

Calculate a plurality of entropy values for the received data unit

730

Select, based on the plurality of entropy values, at least one reduction operation from a plurality of different reduction operations

740

Perform the selected at least one reduction operation on the received data unit

FIG. 7

SELECTION OF REDUCTION OPERATION IN A STORAGE SYSTEM

BACKGROUND

Data reduction techniques can be applied to reduce the amount of data stored in a storage system. Some example data reduction techniques include data compression and data deduplication. Data deduplication identifies data units that are duplicative, and seeks to reduce or eliminate the number of instances of duplicative data units that are stored in the storage system.

BRIEF DESCRIPTION OF THE DRAWINGS

Some implementations are described with respect to the following figures.

FIGS. 2A-2B are illustrations of example data structures, in accordance with some implementations.

FIGS. 4A-4B are illustrations of example processes, in accordance with some implementations.

FIG. 7 is a diagram of an example machine-readable medium storing instructions in accordance with some implementations.

Figure 1A:
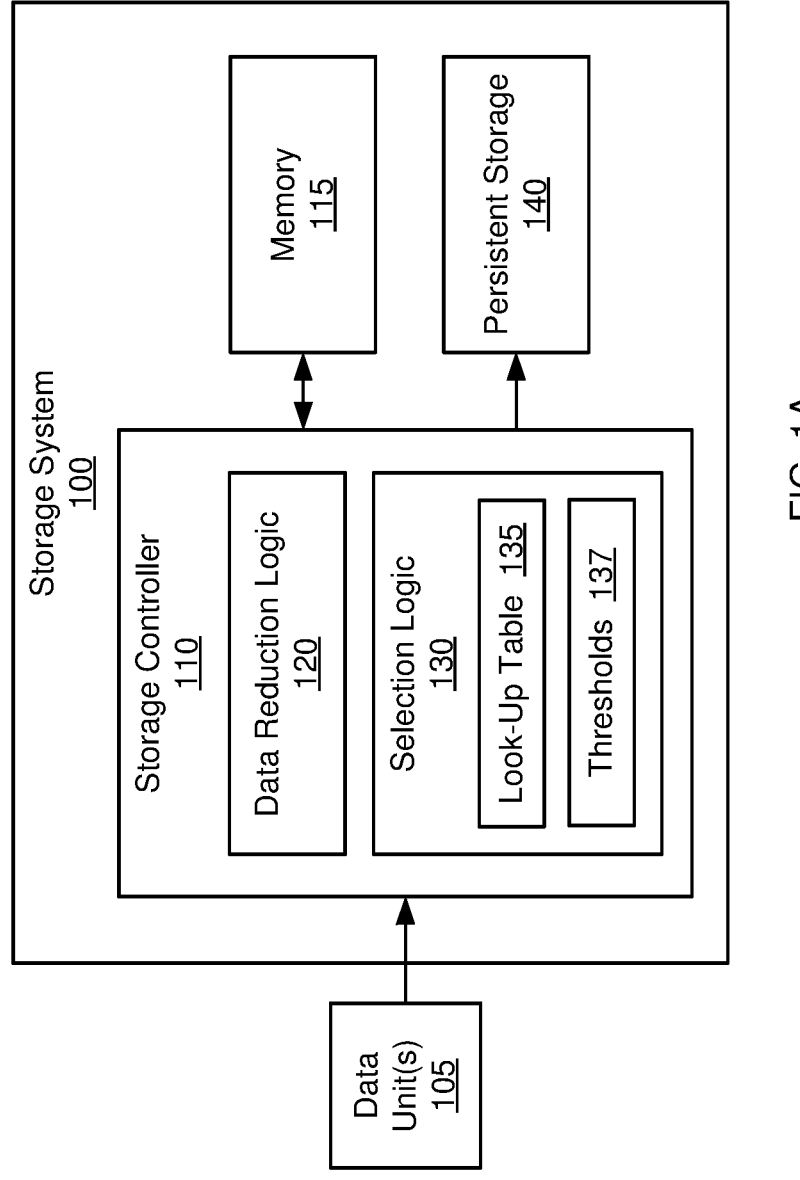
FIGS. 1A-1B are schematic diagrams of an example storage system, in accordance with some implementations.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

In some examples, a storage system may perform data reduction to attempt to reduce the amount of space required to store received data. Such data reduction may be performed using various types of data reduction operations (also referred to herein as "reduction techniques"), including one or more types of data compression, one or more types of data deduplication, or a combination thereof. For example, a data compression technique may include encoding information using fewer bits than used in an original form. Further, a data deduplication technique may include dividing an incoming data stream into multiple data units, and determining which incoming data units are duplicates of previously stored data units. For an incoming data unit that is determined to be a duplicate, the storage system may store a reference to the previous data unit instead of storing the duplicate incoming data unit.

In some examples, a data deduplication technique may include comparing fingerprints of the incoming data units to fingerprints of the stored data units. As used herein, the term "fingerprint" refers to a value derived by applying a function on the content of the data unit (where the "content" can include the entirety or a subset of the content of the data unit). An example of the function that can be applied includes a hash function that produces a hash value based on the incoming data unit. Examples of hash functions include cryptographic hash functions such as the Secure Hash Algorithm 2 (SHA-2) hash functions, e.g., SHA-224, SHA-256, SHA-384, etc. In other examples, other types of hash functions or other types of fingerprint functions may be employed.

A "storage system" can include a storage device or an array of storage devices. A storage system may also include storage controller(s) that manage(s) access of the storage device(s). A "data unit" can refer to any portion of data that can be separately identified in the storage system. In some cases, a data unit can refer to a chunk, a collection of chunks, or any other portion of data. In some examples, a storage system may store data units in persistent storage. Persistent storage can be implemented using one or more of persistent (e.g., nonvolatile) storage device(s), such as disk-based storage device(s) (e.g., hard disk drive(s) (HDDs)), solid state device(s) (SSDs) such as flash storage device(s), or the like, or a combination thereof.

A "controller" can refer to a hardware processing circuit, which can include any or some combination of a microprocessor, a core of a multi-core microprocessor, a microcontroller, a programmable integrated circuit, a programmable gate array, a digital signal processor, or another hardware processing circuit. Alternatively, a "controller" can refer to a combination of a hardware processing circuit and machine-readable instructions (software and/or firmware) executable on the hardware processing circuit.

In some examples, a storage system may receive and store various types of data (e.g., from different applications, with different types of content, etc.). However, some types of data may not be suitable for reduction. Further, some types of data may be only be suitable for particular reduction techniques (e.g., a particular compression technique, a particular deduplication technique, or a combination thereof). Accordingly, attempting to reduce some types of data using a non-suitable reduction technique may consume a relatively large amount of processing time and/or energy, but may provide little or no benefit in terms of reducing the storage space required to store the received data. As such, use of the non-suitable reduction technique may result in relatively slow and/or inefficient performance of the storage system.

In accordance with some implementations of the present disclosure, a storage system may include a storage controller to select a reduction technique to be performed for a received data unit. In some implementations, the storage controller may analyze an incoming data unit to determine one or more entropy values for that data unit, and may compare these entropy values to corresponding thresholds. Further, based on this comparison, the storage controller may select reduction technique(s) to be performed for the data unit. In this manner, the storage controller may avoid attempting to perform data reduction using reduction techniques that are not suitable for a particular data unit. Accordingly, the storage controller may save processing time and/or energy that would otherwise be wasted in unproductive reduction attempts, and may thereby improve the performance and efficiency of the storage system.

Figure 1B:
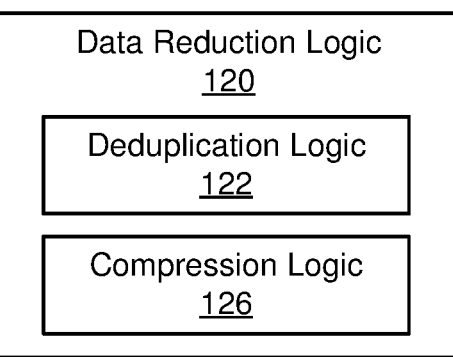

FIGS. 1A-1B—Example Storage System

FIG. 1A shows an example of a storage system 100 that includes a storage controller 110, memory 115, and persistent storage 140, in accordance with some implementations. The persistent storage 140 may include one or more non-transitory storage media such as hard disk drives (HDDs), solid state drives (SSDs), optical disks, and so forth, or a combination thereof. The memory 115 may be implemented in semiconductor memory such as random access memory (RAM).

In some implementations, the storage controller 110 may include or execute data reduction logic 120 and selection logic 130. The storage controller 110 and the included logic 120, 130 may be implemented as a processor executing instructions (e.g., software and/or firmware) that are stored in a machine-readable storage medium, in hardware (e.g., circuitry), and so forth.

In some implementations, the data reduction logic 120 may perform reduction operations to attempt to reduce selected data units 105. For example, as shown in FIG. 1B, the data reduction logic 120 may include deduplication logic 122 and compression logic 126. The deduplication logic 122 may perform one or more types of data deduplication operations. For example, the deduplication logic 122 may generate a fingerprint for a received data unit 105 (e.g., a full or partial hash value), and may compare the generated fingerprint to stored fingerprints of previously received data units. If this comparison results in a match, then it may be determined that a duplicate of the received data unit 105 is already stored by the storage system 100.

In some implementations, the compression logic 126 may perform one or more types of data deduplication operations. For example, the compression logic 126 may perform a first type of compression algorithm (referred to herein as "fast compression") that is completed in a relatively short time period, but which may provide a relatively low compression ratio. In another example, the compression logic 126 may perform a second type of compression algorithm (referred to herein as "slow compression") that is completed in a relatively long time period, but which may provide a relatively high compression ratio. Further, in some implementations, the compression logic 126 may perform multiple types of compression algorithms (e.g., run-length encoding, Huffman coding, arithmetic coding, Lempel-Ziv algorithms, and so forth).

In some implementations, the selection logic 130 may analyze an incoming data unit 105 to select a reduction technique to be performed for the incoming data unit 105. For example, the selection logic 130 may determine one or more numerical values indicating entropy characteristics (referred to herein as "entropy values") for the incoming data unit 105. In some implementations, the selection logic 130 may determine the entropy values based on N samples from the incoming data unit 105, where N is a positive integer value. Further, the selection logic 130 may compare the determined entropy values against corresponding thresholds 137. Based on this comparison, the selection logic 130 may determine whether any reduction techniques are suitable for the incoming data unit 105, and if so, may select one or more suitable reduction techniques to be performed on the incoming data unit 105 (e.g., a particular compression technique, a particular deduplication technique, or a combination thereof). Further, the data reduction logic 120 may perform the selected reduction technique(s) on the incoming data unit 105, and may then store the reduced data in the persistent storage 140 (e.g., as deduplicated and/or compressed data). In this manner, the selection logic 130 may avoid performance of reduction techniques that are not suitable for the incoming data unit 105, and may thereby improve the efficiency of the storage system 100.

In some implementations, the storage controller 110 may perform a process (referred to herein as a "zero detection process") to determine whether all values in an incoming data unit 105 are equal to a zero value. If the zero detection process determines that all values in the data unit are equal to a zero, the storage controller 110 may generate a value or flag (referred to herein as a "zero value representation") that indicates that the data unit includes only zero values, where the zero value representation itself is smaller than the data unit. For example, the zero value representation may be a single bit (e.g., included in an array or other data structure) that represents the data unit, where the value of the bit indicates whether the represented data unit only includes zero values (e.g., a bit value of "1" indicates that the data unit only includes zero values, and a bit value of "0" indicates that the data unit includes at least one non-zero value). In this manner, a data unit that only includes zero values may be stored as a single bit, thereby reducing the amount of space required to store the data unit (e.g., in persistent storage 140).

In some implementations, the selection logic 130 may determine whether each of the N samples of a data unit 105 is equal to a zero value. If each of the N samples is equal to zero, the selection logic 130 may perform the zero detection process for the data unit 105. Otherwise, if at least some of the N samples are not equal to zero, the selection logic 130 may not perform the zero detection process for the data unit 105. In this manner, the selection logic 130 may avoid performing the zero detection process for data units 105 that include non-zero values, and may thereby improve the efficiency of the storage system 100. An example process for determining whether to perform zero detection processing is discussed below with reference to FIG. 5.

In some examples, the reduction operations performed by the data reduction logic 120 may fail to reduce the size of a data unit 105 by at least a minimum amount or ratio (e.g., at least a 2:1 space reduction). Such reduction operations may be referred to herein as "failed" reductions. The minimum amount of reduction that is required for the storage system 100 may be as specified as a system configuration setting. In some implementations, upon detecting a failed reduction of a data unit 105, the data reduction logic 120 may store that data unit 105 in unreduced form in the persistent storage 140 (e.g., as unreduced data).

In some implementations, the selection logic 130 may use multiple entropy values, including a maximum entropy value, a minimum entropy value, and a Shannon entropy value. As used herein, the term "maximum entropy" may refer to a value that measures the maximum possible degree of uncertainty present in a set of data samples. Further, as used herein, the term "minimum entropy" may refer to a value that measures the minimum possible degree of uncertainty present in a set of data samples.

In some examples, a discrete random variable X may have n possible values, where the ith outcome has probability $p_i$. In such examples, the maximum entropy (also referred to as the Hartley entropy) may be calculated as the binary log of the number of values that X can take on with non-zero probability, which may be represented as $\log_2 n$. Further, in some examples, the minimum entropy (also referred to as the Rényi entropy) may be calculated as the negative binary log of the probability of the most probable outcome, which may be represented as $-\log_2(\max p_i)$. Furthermore, in some examples, the Shannon entropy may be calculated as the negative of the sum of the probability of each outcome multiplied by the binary log of the probability of each outcome, which may be represented as $-\Sigma^n (p_i*\log_2(p_i))$.

In some implementations, the selection logic 130 may use modified calculations to calculate the maximum, minimum, and Shannon entropy values. For example, the modified calculations performed by selection logic 130 may use integer arithmetic to calculate the maximum, minimum, and Shannon entropy values. Examples of the modified calculations performed by selection logic 130 are discussed below with reference to FIGS. 4A-4B. In another example, the modified calculations use a look-up table 135 to calculate the maximum, minimum, and Shannon entropy values. The look-up table 135 may be a stored data structure including an array of constants to determine binary logarithm values. An example implementation of the look-up table 135 is discussed below with reference to FIG. 2A. In some implementations, the modified calculations performed by selection logic 130 may avoid performing floating-point arithmetic, as well as the direct computation of binary logarithms. Accordingly, the use of the modified calculations may reduce the processing load associated with using the selection logic 130.

In some implementations, the selection logic 130 may periodically identify a data unit 105 having an entropy value that is within a given amount away from the corresponding threshold 137 (e.g., does not satisfy the threshold 137, but is within a specified distance from the threshold 137). The selection logic 130 may perform reduction operations for the identified data unit 105, and may determine whether the attempted reduction has failed. Upon determining that the attempted reduction did not fail, the selection logic 130 may adjust the threshold 137 so that the entropy value of the data unit 105 satisfies the adjusted threshold 137. In this manner, the selection logic 130 may periodically adjust the thresholds 137 to better correspond to entropy levels associated with data units that are suitable for reduction, and may thereby improve the performance of data reduction in the storage system 100.

FIGS. 2A-2B—Example Data Structures

FIG. 2A shows an example look-up table 135, in accordance with some implementations. As shown, the look-up table 135 may include multiple entries, with each entry corresponding to a different combination of an index value I and a constant value C. In some implementations, the selection logic 130 (shown in FIG. 1A) may match an input against the index values I of the look-up table 135, and may thereby determine the constant value C that corresponds to the input value. It is noted that, while FIG. 2A shows the index values I as data fields that are stored in the look-up table 135, other implementations are possible. For example, the look-up table 135 may be implemented as an ordered array of constants, and the index value I for a given constant C may be determined by the particular position of that constant C in the ordered array (e.g., the first position has index I=0, the second position has index I=1, and so forth).

In some implementations, the index values I of the look-up table 135 may correspond to a defined range of integer values (e.g., 0 to 256). Further, for each index value I, the corresponding constant C may be a floating-point number of a given length (e.g., seven digits) that is calculated as the binary logarithm of the index value I (i.e., $\log_2(I)$). Accordingly, in such implementations, the binary logarithm of I may be obtained by performing a look-up of the input I in the look-up table 135. In this manner, use of the look-up table 135 may allow logarithm values to be determined without using floating-point arithmetic, and may thus reduce the amount of processing required by the selection logic 130 to determine entropy values.

FIG. 2B shows an example implementation of a data structure storing the thresholds 137. In some implementations, the thresholds 137 may include, in order of increasing value, a first lower threshold (LT1), a second lower threshold (LT2), a third threshold (T3), a first upper threshold (UT1), and a second upper threshold (UT2). However, other implementations are possible. The thresholds 137 may be compared against corresponding entropy values generated by the selection logic 130 in order to determine whether a given data unit is suitable for data reduction. An example process for comparing the thresholds 137 to corresponding entropy values is discussed below with reference to FIG. 3.

Figure 3A:
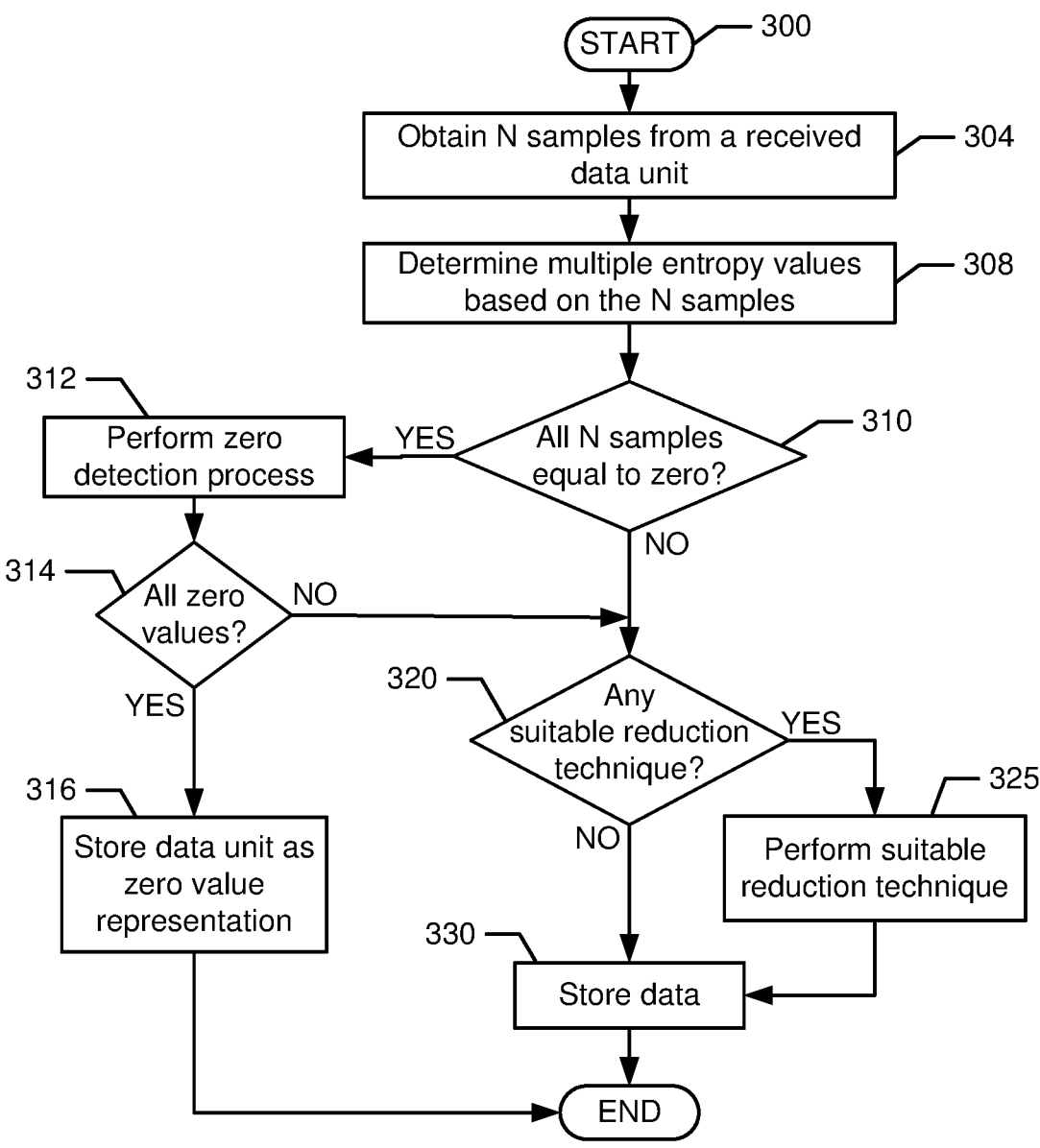
FIGS. 3A-3B are illustrations of example processes, in accordance with some implementations.

FIG. 3A—Example Process for Storing Data

FIG. 3A shows an example process 300 for storing data, in accordance with some implementations. In some examples, the process 300 may be performed using the storage controller 110 (shown in FIG. 1A). The process 300 may be implemented in hardware or a combination of hardware and programming (e.g., machine-readable instructions executable by a processor(s)). The machine-readable instructions may be stored in a non-transitory computer readable medium, such as an optical, semiconductor, or magnetic storage device. The machine-readable instructions may be executed by a single processor, multiple processors, a single processing engine, multiple processing engines, and so forth. For the sake of illustration, details of the process 300 may be described below with reference to FIGS. 1A-2B, which show examples in accordance with some implementations. However, other implementations are also possible.

Block 304 may include obtaining N samples from a received data unit, where N is a positive integer value. For example, referring to FIG. 1A, the storage controller 110 receives an inbound data stream, and divides the data stream into separate 16384-byte data units (e.g., corresponding to a cache memory page). For a first data unit, the storage controller 110 generates samples of 8 randomly chosen bytes, with each sample being taken from each of 32 uniformly distributed blocks within the first data unit.

Referring again to FIG. 3A, block 308 may include determining multiple entropy values based on the N samples. For example, referring to FIG. 1A, the selection logic 130 performs modified calculations to determine at least maximum and minimum entropy values based on the N samples of the first data unit. In some implementations, these modified calculations are performed using the look-up table 135. An example process for calculating the maximum and minimum entropy values is discussed below with reference to FIG. 4A.

Referring again to FIG. 3A, decision block 310 may include determining whether all of the N samples of the data unit are equal to zero. Upon a negative determination ("NO") at decision block 310, the process 300 may continue at decision block 320 (described below). Otherwise, upon a positive determination ("YES") at decision block 310, the process 300 may continue at block 312, including performing a zero detection process. For example, referring to FIG. 1A, the storage controller 110 determines that each of the N samples of a data unit 105 is equal to zero. In response to this determination, the storage controller 110 performs a zero detection process to determine whether all values in the data unit 105 are equal to zero.

Referring again to FIG. 3A, decision block 314 may include determining whether all values of the data unit are equal to zero. Upon a positive determination ("YES") at decision block 314, the process 300 may continue at block 316, including storing the data unit as a zero value representation. After block 316, the process 300 may be completed. For example, referring to FIG. 1A, the zero detection process determines that all values in the data unit are equal to zero. In response to this determination, the storage controller 110 may generate a zero value representation that indicates that the data unit includes only zero values. In some implementations, the zero value representation may be a single bit (or a set of bits) included in an array or other data structure.

Referring again to FIG. 3A, upon a negative determination ("NO") at decision block 314 or at decision block 310, the process 300 may continue at decision block 320, including determining whether any reduction technique is suitable for the data unit. Upon a positive determination ("YES") at decision block 320, the process 300 may continue at block 325, including performing the suitable reduction technique for the data unit. After block 325, the process 300 may continue at block 330, including storing the reduced data. For example, referring to FIG. 1A, the storage controller 110 compares the multiple entropy values (determined at block 308) against the corresponding thresholds 137. Based on this comparison, the storage controller 110 selects a reduction technique to be performed on the data unit 105 (e.g., a particular compression technique, a particular deduplication technique, or a combination thereof). Further, the storage controller 110 performs the selected reduction technique on the data unit 105, and stores the reduced data in the persistent storage 140. An example implementation of selection of a reduction technique based on multiple entropy values is discussed below with reference to FIG. 3B.

Referring again to FIG. 3A, upon a negative determination ("NO") at decision block 320, the process 300 may continue at block 330, including storing the data unit without reduction. After block 330, the process 300 may be completed. In some examples, the process 300 may be repeated for multiple data units 105 received by the storage system 100. For example, referring to FIG. 1A, the storage controller 110 determines that there are no reduction techniques that are suitable for the data unit (e.g., based on the comparison of the multiple entropy values to the corresponding thresholds 137). Accordingly, the storage controller 110 stores the data unit 105 in an unreduced form (e.g., without performing any reduction operation).

Figure 3B:
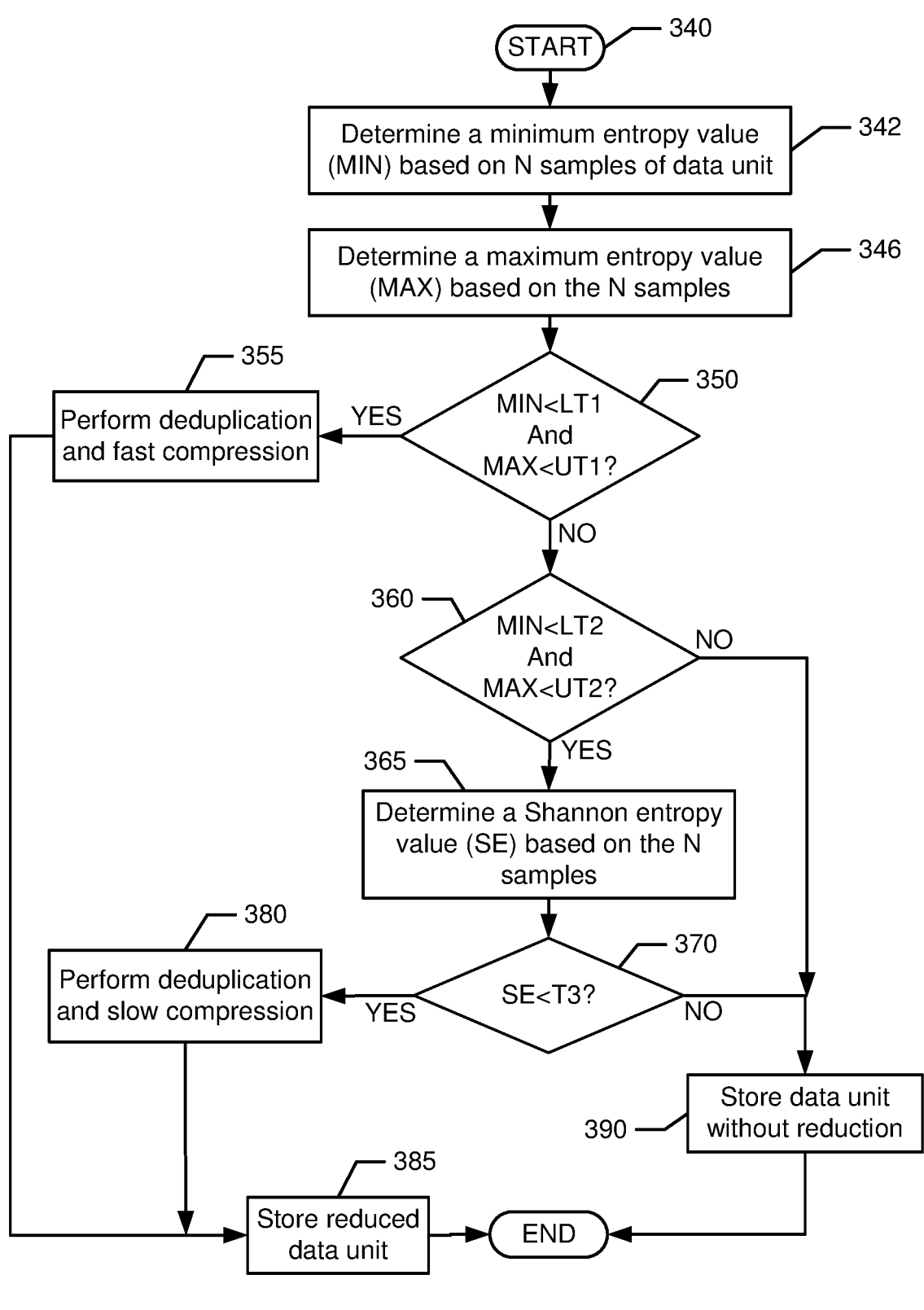

FIG. 3B—Example Process for Storing Data

FIG. 3B shows an example process 340 for storing data, in accordance with some implementations. In some examples, the process 340 may be performed using the storage controller 110 (shown in FIG. 1A). The process 340 may be implemented in hardware or a combination of hardware and programming (e.g., machine-readable instructions executable by a processor(s)). The machine-readable instructions may be stored in a non-transitory computer readable medium, such as an optical, semiconductor, or magnetic storage device. The machine-readable instructions may be executed by a single processor, multiple processors, a single processing engine, multiple processing engines, and so forth. For the sake of illustration, details of the process 340 may be described below with reference to FIGS. 1A-2B, which show examples in accordance with some implementations. However, other implementations are also possible.

Block 342 may include determining a minimum entropy value (MIN) based on N samples of a received data unit. Block 346 may include determining a maximum entropy value (MAX) based on the N samples. After block 346, the process 340 may continue at decision block 350 (described below). For example, referring to FIG. 1A, the storage controller 110 receives an inbound data stream, and divides the data stream into separate data units 105. The storage controller 110 obtains N samples from a first data unit 105, where N is a positive integer. Further, the storage controller 110 performs modified calculations to determine maximum and minimum entropy values. In some implementations, these modified calculations are performed using the look-up table 135. An example process for calculating the maximum and minimum entropy values is discussed below with reference to FIG. 4A.

Referring again to FIG. 3B, decision block 350 may include determining whether the minimum entropy value (MIN) is smaller than a first lower threshold (LT1), and the maximum entropy value (MAX) is smaller than a first upper threshold (UT1). Upon a positive determination ("YES") at decision block 350, the process 340 may continue at block 355, including performing deduplication and fast compression operations. After block 355, the process 340 may continue at block 385, including storing the reduced form of the data unit. For example, referring to FIG. 1A, the storage controller 110 determines that the minimum entropy value (MIN) is smaller than the first lower threshold (e.g., LT1 equal to 4.0, as shown in FIG. 2B), and also determines that the maximum entropy value (MAX) is smaller than the first upper threshold (e.g., UT1 equal to 6.0, as shown in FIG. 2B). In response to these two determinations, the storage controller 110 performs a deduplication operation (e.g., using the deduplication logic 122) and a fast compression operation (e.g., using the compression logic 126) to reduce the data unit 105. Further, the storage controller 110 causes the reduced form of the data unit 105 to be stored in the persistent storage 140 (e.g., as deduplicated and fast compressed data).

Referring again to FIG. 3B, upon a negative determination ("NO") at decision block 350 (i.e., if the minimum entropy value (MIN) is not smaller than the first lower threshold (LT1), or if the maximum entropy value (MAX) is not smaller than the first upper threshold (UT1)), the process 340 may continue at decision block 360, including determining whether the minimum entropy value (MIN) is smaller than a second lower threshold (LT2), and the maximum entropy value (MAX) is smaller than a second upper threshold (UT2). Upon a positive determination ("YES") at decision block 360, the process 340 may continue at block 365, including determining a Shannon entropy value (SE) based on the N samples. After block 360, the process 300 may continue at decision block 370 (described below). However, upon a negative determination ("NO") at decision block 360 (i.e., if the minimum entropy value (MIN) is not smaller than the second lower threshold (LT2), or if the maximum entropy value (MAX) is not smaller than the second upper threshold (UT2)), the process 340 may continue at block 390 (described below). For example, referring to FIG. 1A, the storage controller 110 determines that the minimum entropy value (MIN) is smaller than the second lower threshold (e.g., LT2 equal to 5.0, as shown in FIG. 2B), and also determines that the maximum entropy value (MAX) is smaller than the second upper threshold (e.g., UT2 equal to 7.5, as shown in FIG. 2B). In response to these determinations, the storage controller 110 performs a modified calculation to determine a Shannon entropy value. In some implementations, this modified calculation is performed using the look-up table 135. An example process for calculating the Shannon entropy value is discussed below with reference to FIG. 4B.

Referring again to FIG. 3B, decision block 370 may include determining whether the Shannon entropy value (SE) is smaller than a third threshold (T3). Upon a positive determination ("YES") at decision block 370, the process 340 may continue at block 380, including performing deduplication and slow compression operations. After block 380, the process 340 may continue at block 385 (described above). However, upon a negative determination ("NO") at decision block 370 (i.e., if the Shannon entropy value (SE) is not smaller than a third threshold (T3)), the process 340 may continue at block 390, including storing the data unit without performing any data reduction. After either block 385 or block 390, the process 340 may be completed. In some examples, the process 340 may be repeated for multiple data units 105 received by the storage system 100. For example, referring to FIG. 1A, if the storage controller 110 determines that the Shannon entropy value (SE) is smaller than the third threshold (e.g., T3 equal to 5.5, as shown in FIG. 2B), the storage controller 110 performs a deduplication operation (e.g., using the deduplication logic 122) and a slow compression operation (e.g., using the compression logic 126) to reduce the data unit 105. Further, the storage controller 110 causes the reduced form of the data unit 105 to be stored in the persistent storage 140 (e.g., as deduplicated and slow compressed data). Otherwise, if the Shannon entropy value (SE) is not smaller than the third threshold, the storage controller 110 does not reduce the data unit 105, and instead stores the data unit 105 in the persistent storage 140 as unreduced data. Further, if the reduction of the data unit 105 is not successful, the storage controller 110 stores the data unit 105 in the persistent storage 140 as unreduced data. FIGS. 4A-4B—Example Processes for Calculating Entropy Values FIG. 4A shows an example process 400 for calculating the maximum and minimum entropy values. Further, FIG. 4B shows an example process 405 for calculating a Shannon entropy value. In some examples, the processes 400, 405 may be performed using the storage controller 110 (shown in FIG. 1A). The processes 400, 405 may be implemented in hardware or a combination of hardware and programming (e.g., machine-readable instructions executable by a processor(s)). The machine-readable instructions may be stored in a non-transitory computer readable medium, such as an optical, semiconductor, or magnetic storage device. The machine-readable instructions may be executed by a single processor, multiple processors, a single processing engine, multiple processing engines, and so forth. For the sake of illustration, details of processes 400, 405 may be described below with reference to FIGS. 1A-2B, which show examples in accordance with some implementations. However, other implementations are also possible.

Referring now to FIG. 4A, block 410 may include initializing a maximum probability variable ("Max_Prob") to a value of 1. Block 420 may include initializing a cardinality variable ("Cardinality") to a value of 0. Block 430 may include obtaining N samples from the data unit. For example, referring to FIG. 1A, the storage controller 110 may generate samples of 8 randomly chosen bytes, with each sample being taken from each of 32 uniformly distributed blocks within a 16384-byte data unit (e.g., a cache memory page).

At block 440, a loop (defined by blocks 440-448) may be entered to process each sample in the data unit (obtained at block 430). Block 442 may include determining the value I of the current sample. Block 444 may include determining a count of the sample value I ("count (I)") (i.e., the number of instances that the value I has occurred so far in the samples of the data unit). If the count of the sample value I is currently equal to 0, the cardinality variable may be incremented by 1. In some implementations, the count of the sample value I ("count (I)") may be determined using a histogram function.

Block 446 may include incrementing the count of sample value I by 1. Block 448 may include, if the count of the sample value I is greater than the current maximum probability variable, setting the maximum probability variable equal to the current count of sample value I. After block 448, the loop may return to block 440 (i.e., to process another sample in the data unit). After all of the samples have been processed at block 440, the process 400 may continue at block 450.

Block 450 may include setting the minimum entropy value ("MIN") equal to the value of the formula $Int(A(B-\log_2(Max\_Prob)))$ (i.e., the integer cast of the product of constant A times the difference between constant B minus the binary logarithm of the maximum probability variable). For example, in some implementations, the variable A may be equal to 10, and the variable B may be equal to 8. Further, in some implementations, the binary logarithm of the maximum probability variable may be determined by performing a look-up of the maximum probability variable in the look-up table 135.

Block 460 may include setting the maximum entropy value ("MAX") equal to the value of the formula $Int(A*\log_2(MaxCardinality))$ (i.e., the integer cast of the product of constant A times the binary logarithm of the cardinality variable). In some implementations, the binary logarithm of the cardinality variable may be determined by performing a look-up of the cardinality variable in the look-up table 135. After block 460, the process 400 may be completed.

Referring now to FIG. 4B, block 465 may include initializing a total variable ("Total") to a value of 0. At block 470, a loop (defined by blocks 470-475) may be entered to process each sample value I (determined at block 442 in FIG. 4A) in the data unit. Block 475 may include setting the value of the total variable equal to the previous value of the total variable plus the value of the formula $count(I)*(B-\log(count(I)))$ (i.e., the product of the count of the sample value I times the difference between the variable B minus the binary logarithm of the count of the sample value I). In some implementations, the binary logarithm of the count of the sample value I may be determined by performing a look-up of the count of the sample value I in the look-up table 135.

After all of the sample values I have been processed at block 470, the process 405 may continue at block 480. Block 480 may include setting the Shannon entropy value (SE) equal to the value of the formula $Int(A*(Total>>B))$ (i.e., the integer cast of the product of constant A times the total variable that is bitwise right-shifted by B bits). After block 480, the process 405 may be completed.

Figure 5:
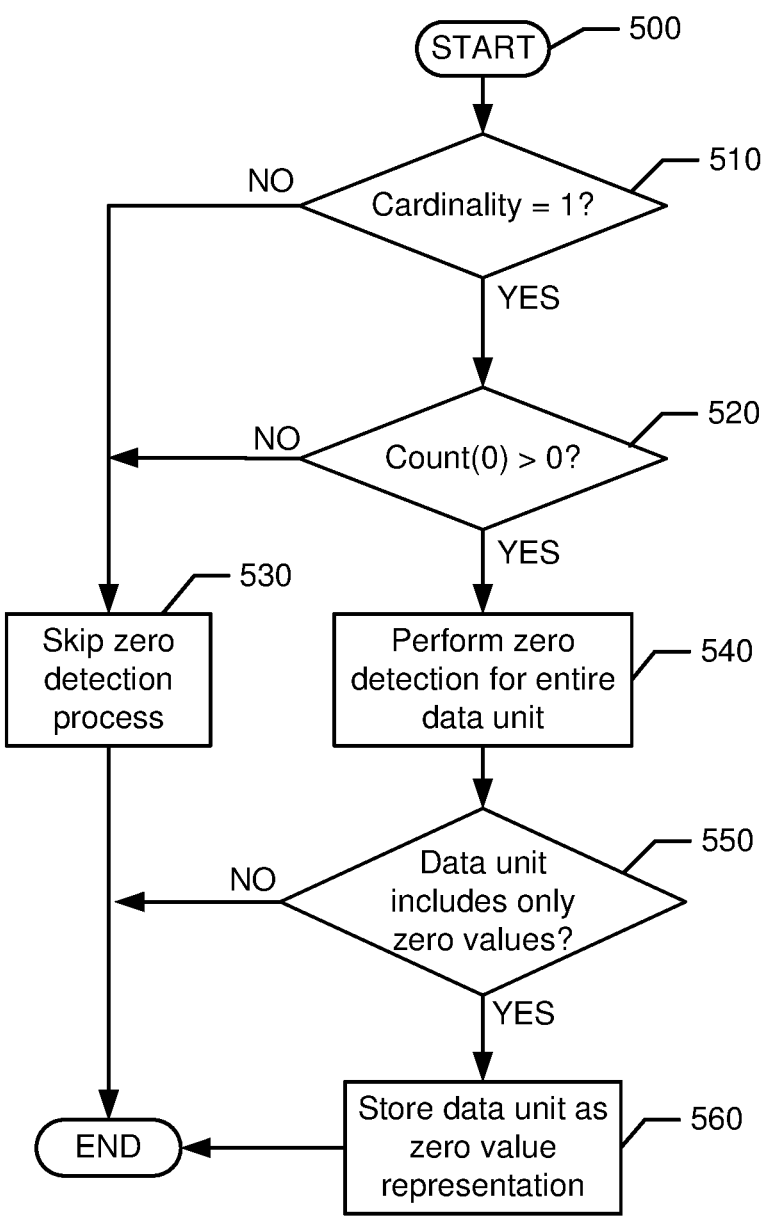
FIG. 5 is an illustration of an example process, in accordance with some implementations.

FIG. 5—Example Process for Zero Detection

FIG. 5 shows an example process 500 for zero detection, in accordance with some implementations. The process 500 may illustrate an example implementation of blocks 310, 312, 314, and 316 (shown in FIG. 3A). Accordingly, in some implementations, the process 500 may be performed after obtaining N samples from a received data unit, and determining multiple entropy values based on the N samples (at blocks 304 and 308 of FIG. 3A). Further, in some implementations, the process 500 may be performed after completing the process 400 for calculating the maximum and minimum entropy values (shown in FIG. 4A), including calculating a cardinality value ("Cardinality") and multiple count values ("count(I)") based on the N samples of the data unit.

In some examples, the process 500 may be performed using the storage controller 110 (shown in FIG. 1A). The process 500 may be implemented in hardware or a combination of hardware and programming (e.g., machine-readable instructions executable by a processor(s)). The machine-readable instructions may be stored in a non-transitory computer readable medium, such as an optical, semiconductor, or magnetic storage device. The machine-readable instructions may be executed by a single processor, multiple processors, a single processing engine, multiple processing engines, and so forth. For the sake of illustration, details of the process 500 may be described below with reference to FIGS. 1A-2B, which show examples in accordance with some implementations. However, other implementations are also possible.

Decision block 510 may include determining whether a cardinality value is equal to one (1). Upon a positive determination ("YES") at decision block 510, the process 500 may continue at decision block 520 (described below). Otherwise, upon a negative determination ("NO") at decision block 510, the process 500 may continue at block 530, including skipping a zero detection process. After block 530, the process 500 may be completed. For example, referring to FIG. 1A, the storage controller 110 receives an inbound data stream, and divides the data stream into separate data units 105. The storage controller 110 obtains N samples from a data unit 105, and performs the process 400 (shown in FIG. 4A) to determine maximum and minimum entropy values for the data unit 105. After completing the process 400, the storage controller 110 determines whether the calculated cardinality value is equal to one, thereby indicating that all N samples have the same identical value. Upon determining that the cardinality is not equal to one (i.e., the N samples included two or more different values), the storage controller 110 skips or otherwise avoids performance of a zero detection process for the data unit 105.

Referring again to FIG. 5, decision block 520 may include determining whether the count of the value "0" is greater than zero (0). Upon a negative determination ("NO") at decision block 520, the process 500 may continue at block 530 (described above). Otherwise, upon a positive determination ("YES") at decision block 520 (i.e., if the count of the value "0" is greater than zero), the process 500 may continue at block 540, including performing the zero detection process for the entire data unit. After block 540, the process 500 may continue at decision block 550 (described below). For example, referring to FIG. 1A, the storage controller 110 determines whether the calculated count (0) is greater than zero, thereby indicating that the value "0" appears in at least one sample. If the value "0" appears in at least one sample, it is determined that all N samples have the value "0." Stated differently, upon determining at decision block 510 that the cardinality value is equal to one (i.e., all N samples have the same value), and also determining at decision block 520 that the value "0" is present in the samples, it is determined that all N samples have the value "0." Accordingly, because all N samples have the value "0," the storage controller 110 performs the zero detection process for the entire data unit 105. Otherwise, if it is determined that all N samples do not have the value "0," the zero detection process is unnecessary, and the storage controller 110 skips the zero detection process. In this manner, the process 500 may use the calculation of the maximum and minimum entropy values to avoid performing the zero detection process when it is unnecessary. Accordingly, the process 500 may improve the efficiency of the storage system 100.

Referring again to FIG. 5, decision block 550 may include determining whether the data unit includes only "0" values. Upon a positive determination ("YES") at decision block 550, the process 500 may continue at block 560, including storing the data unit as a zero value representation. After block 560, or upon a negative determination ("NO") at decision block 550, the process 500 may be completed. For example, referring to FIG. 1A, the zero detection process determines that all values in the data unit are equal to zero. In response to this determination, the storage controller 110 may generate a zero value representation that indicates that the data unit includes only zero values. In some implementations, the zero value representation may be a single bit (or a set of bits) included in an array or other data structure.

Figure 6:
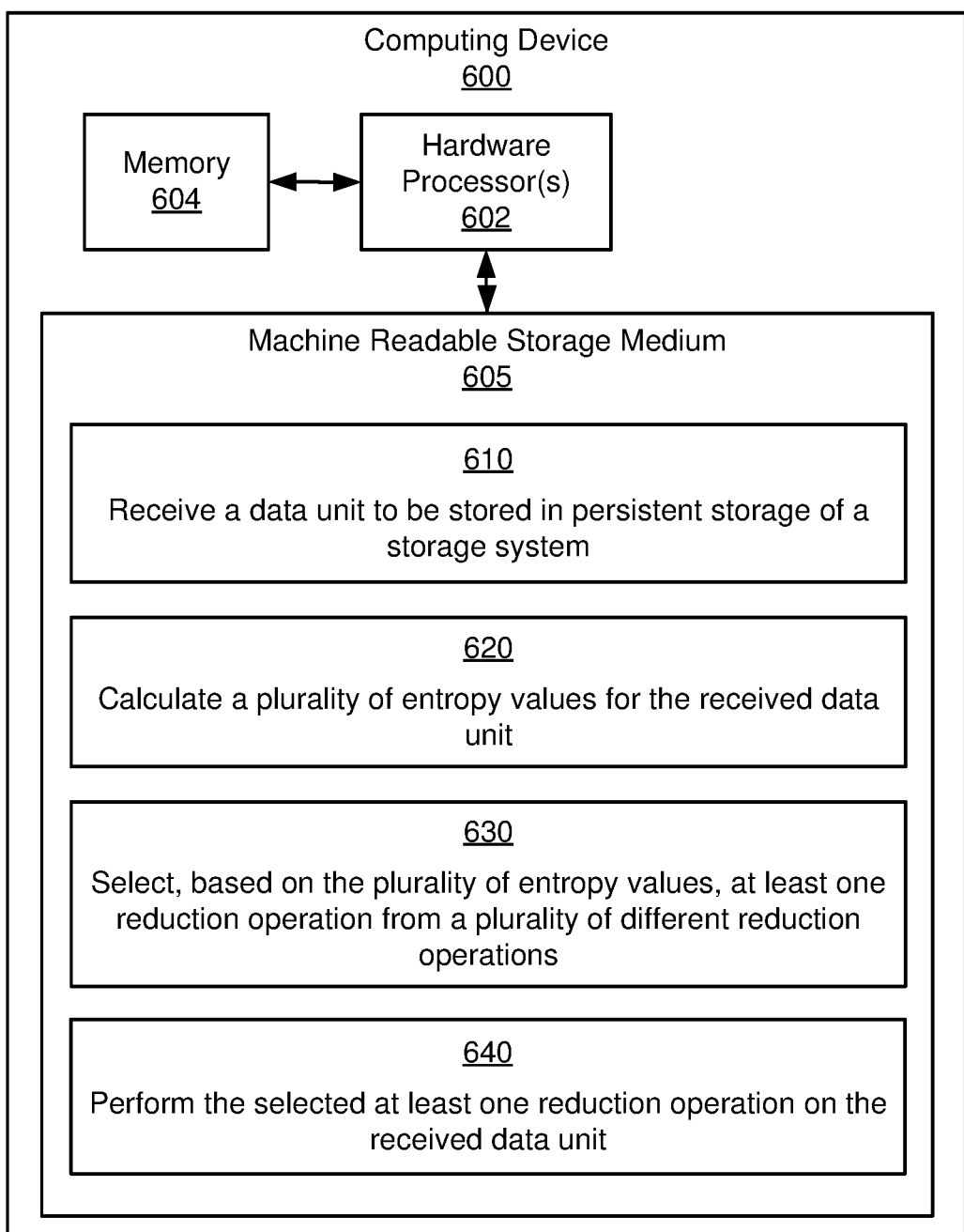
FIG. 6 is a schematic diagram of an example computing device, in accordance with some implementations.

FIG. 6—Example Computing Device

FIG. 6 shows a schematic diagram of an example computing device 600. In some examples, the computing device 600 may correspond generally to some or all of the storage system 100 (shown in FIG. 1A). As shown, the computing device 600 may include hardware processor 602 and machine-readable storage 605 including instructions 610-640. The machine-readable storage 605 may be a non-transitory medium. The instructions 610-640 may be executed by the hardware processor 602, or by a processing engine included in hardware processor 602.

Instruction 610 may be executed to receive a data unit to be stored in a persistent storage of a storage system. Instruction 620 may be executed to calculate a plurality of entropy values for the received data unit. For example, referring to FIG. 1A, the storage controller 110 receives an inbound data stream, and divides the data stream into separate data units 105. The storage controller 110 obtains N samples from a data unit 105, and performs the process 400 (shown in FIG. 4A) to determine maximum and minimum entropy values for the data unit 105.

Instruction 630 may be executed to select, based on the plurality of entropy values, at least one reduction operation from a plurality of different reduction operations. Instruction 640 may be executed to perform the selected at least one reduction operation on the received data unit. For example, referring to FIGS. 1A, the storage controller 110 determines that the minimum entropy value (MIN) is smaller than the first lower threshold (e.g., LT1), and also determines that the maximum entropy value (MAX) is smaller than the first upper threshold (e.g., UT1). In response to these determinations, the storage controller 110 performs a deduplication operation (e.g., using the deduplication logic 122) and a fast compression operation (e.g., using the compression logic 126) to reduce the data unit 105.

FIG. 7—Example Machine-Readable Medium

FIG. 7 shows a machine-readable medium 700 storing instructions 710-740, in accordance with some implementations. The instructions 710-740 can be executed by a single processor, multiple processors, a single processing engine, multiple processing engines, and so forth. The machine-readable medium 700 may be a non-transitory storage medium, such as an optical, semiconductor, or magnetic storage medium.

Instruction 710 may be executed to receive a data unit to be stored in a persistent storage of a storage system. Instruction 720 may be executed to calculate a plurality of entropy values for the received data unit. Instruction 730 may be executed to select, based on the plurality of entropy values, at least one reduction operation from a plurality of different reduction operations. Instruction 740 may be executed to perform the selected at least one reduction operation on the received data unit.

Figure 8:
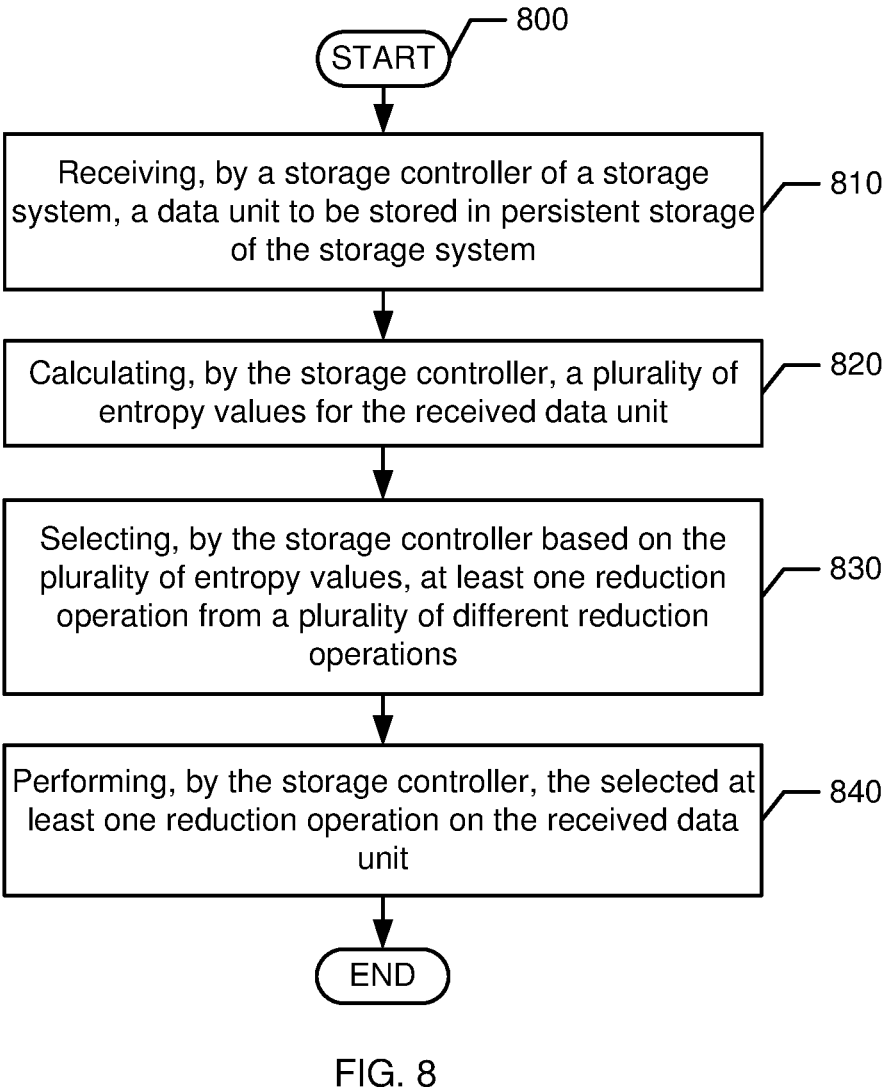
FIG. 8 is an illustration of an example process, in accordance with some implementations.

FIG. 8—Example Process for Storing Data

FIG. 8 shows an example process 800 for storing data, in accordance with some implementations. In some examples, the process 800 may be performed using the storage controller 110 (shown in FIG. 1A). The process 800 may be implemented in hardware or a combination of hardware and programming (e.g., machine-readable instructions executable by a processor(s)). The machine-readable instructions may be stored in a non-transitory computer readable medium, such as an optical, semiconductor, or magnetic storage device. The machine-readable instructions may be executed by a single processor, multiple processors, a single processing engine, multiple processing engines, and so forth. However, other implementations are also possible.

Block 810 may include receiving, by a storage controller of a storage system, a data unit to be stored in persistent storage of the storage system. Block 820 may include calculating, by the storage controller, a plurality of entropy values for the received data unit. Block 830 may include selecting, by the storage controller based on the plurality of entropy values, at least one reduction operation from a plurality of different reduction operations. Block 840 may include performing, by the storage controller, the selected at least one reduction operation on the received data unit.

In accordance with some implementations described herein, a storage system may include a storage controller to select a reduction technique to be performed for a received data unit. In some implementations, the storage controller may analyze an incoming data unit to determine one or more entropy values for that data unit, and may compare these entropy values to corresponding thresholds. Further, based on this comparison, the storage controller may select reduction technique(s) to be performed for the data unit. In this manner, the storage controller may avoid attempting to perform data reduction using reduction techniques that are not suitable for a particular data unit. Accordingly, the storage controller may save processing time and/or energy that would otherwise be wasted in unproductive reduction attempts, and may thereby improve the performance and efficiency of the storage system Note that, while FIGS. 1A-8 show various examples, implementations are not limited in this regard. For example, referring to FIG. 1A, it is contemplated that the storage system 100 may include additional devices and/or components, fewer components, different components, different arrangements, and so forth. In another example, it is contemplated that the functionality of the storage controller 110 described above may be included in any another engine or software of storage system 100. Other combinations and/or variations are also possible.

Data and instructions are stored in respective storage devices, which are implemented as one or multiple computer-readable or machine-readable storage media. The storage media include different forms of non-transitory memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices.

Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A storage system comprising:
a processor; and
a machine-readable storage storing instructions, the instructions executable by the processor to:
    receive a data unit to be stored in a persistent storage of the storage system;
    calculate a plurality of entropy values for the received data unit, wherein each entropy value of the plurality of entropy values indicates a different entropy characteristic of an entirety of the received data unit, and wherein each entropy value of the plurality of entropy values is calculated using a different type of entropy calculation;
    select, based on the plurality of entropy values, at least one reduction operation from a plurality of different reduction operations; and
    perform the selected at least one reduction operation on the received data unit.

2. The storage system of claim 1, wherein:
the plurality of different reduction operations comprises at least one type of data deduplication operation and at least one type of data compression operation, and
the plurality of entropy values comprises a minimum entropy value and a maximum entropy value.

3. The storage system of claim 2, including instructions executable by the processor to:
compare the minimum entropy value to a first lower threshold;
compare the maximum entropy value to a first upper threshold; and
in response to a determination that the minimum entropy value is smaller than the first lower threshold, and the maximum entropy value is smaller than the first upper threshold:
    perform a data deduplication operation on the received data unit,
    perform a fast compression operation on the received data unit, and
    store a reduced version of the data unit in the persistent storage.

4. The storage system of claim 3, including instructions executable by the processor to, in response to at least one of a determination that the minimum entropy value is not smaller than the first lower threshold, and a determination that the maximum entropy value is not smaller than the first upper threshold:

compare the minimum entropy value to a second lower threshold;

compare the maximum entropy value to a second upper threshold; and in response to at least one of a determination that the minimum entropy value is not smaller than the second lower threshold, and a determination that the maximum entropy value is not smaller than the second upper threshold, store the data unit in the persistent storage without attempting to reduce the data unit.

5. The storage system of claim 4, including instructions executable by the processor to, in response to a determination that the minimum entropy value is smaller than the second lower threshold, and the maximum entropy value is smaller than the second upper threshold:

determine a Shannon entropy value for the received data unit;

compare the Shannon entropy value to a third threshold; and in response to a determination that the Shannon entropy value is smaller than the third threshold:

perform the data deduplication operation on the received data unit, perform a slow compression operation on the received data unit, store the reduced version of the data unit in the persistent storage.

6. The storage system of claim 5, including instructions executable by the processor to, in response to a determination that the Shannon entropy value is not smaller than the third threshold:

store the data unit in the persistent storage without attempting to reduce the data unit.

7. The storage system of claim 1, including instructions executable by the processor to:

calculate the plurality of entropy values using a look-up table, wherein the look-up table stores a plurality of constants associated with a plurality of index values, and wherein each constant represents a binary logarithm of a different index value.

8. The storage system of claim 1, including instructions executable by the processor to:

obtain a plurality of samples from the received data unit;

perform, based on the plurality of samples, a calculation of the plurality of entropy values;

determine, based on the calculation of the plurality of entropy values, whether each of the plurality of samples is equal to zero;

in response to a determination that each of the plurality of samples is equal to zero, perform a zero detection process for an entirety of the received data unit; and in response to a determination that at least one of the plurality of samples is not equal to zero, skip performance of the zero detection process for the received data unit.

9. A non-transitory machine-readable medium storing instructions that upon execution cause a processor to:

receive a data unit to be stored in a persistent storage of a storage system;

calculate a plurality of entropy values for the received data unit, wherein each entropy value of the plurality of entropy values indicates a different entropy characteristic of an entirety of the received data unit, and wherein each entropy value of the plurality of entropy values is calculated using a different type of entropy calculation;

select, based on the plurality of entropy values, at least one reduction operation from a plurality of different reduction operations; and perform the selected at least one reduction operation on the received data unit.

10. The non-transitory machine-readable medium of claim 9, wherein:

the plurality of different reduction operations comprises at least one type of data deduplication operation and at least one type of data compression operation, and the plurality of entropy values comprises a minimum entropy value and a maximum entropy value.

11. The non-transitory machine-readable medium of claim 10, including instructions that upon execution cause the processor to:

compare the minimum entropy value to a first lower threshold;

compare the maximum entropy value to a first upper threshold; and in response to a determination that the minimum entropy value is smaller than the first lower threshold, and the maximum entropy value is smaller than the first upper threshold:

perform a data deduplication operation on the received data unit, perform a fast compression operation on the received data unit, and store a reduced version of the data unit in the persistent storage.

12. The non-transitory machine-readable medium of claim 11, including instructions executable by the processor to, in response to at least one of a determination that the minimum entropy value is not smaller than the first lower threshold, and a determination that the maximum entropy value is not smaller than the first upper threshold:

compare the minimum entropy value to a second lower threshold;

compare the maximum entropy value to a second upper threshold; and in response to at least one of a determination that the minimum entropy value is not smaller than the second lower threshold, and a determination that the maximum entropy value is not smaller than the second upper threshold, store the data unit in the persistent storage without attempting to reduce the data unit.

13. The non-transitory machine-readable medium of claim 12, including instructions executable by the processor to, in response to a determination that the minimum entropy value is smaller than the second lower threshold, and the maximum entropy value is smaller than the second upper threshold:

determine a Shannon entropy value for the received data unit;

compare the Shannon entropy value to a third threshold; and in response to a determination that the Shannon entropy value is smaller than the third threshold:

perform the data deduplication operation on the received data unit, perform a slow compression operation on the received data unit, store the reduced version of the data unit in the persistent storage.

14. The non-transitory machine-readable medium of claim 10, including instructions that upon execution cause the processor to:

calculate the minimum entropy value and the maximum entropy value using a look-up table, wherein the look-up table stores a plurality of constants associated with a plurality of index values, and wherein each constant represents a binary logarithm of a different index value.

15. The non-transitory machine-readable medium of claim 9, including instructions that upon execution cause the processor to:

obtain a plurality of samples from the received data unit;

perform, based on the plurality of samples, a calculation of the plurality of entropy values;

determine, based on the calculation of the plurality of entropy values, whether each of the plurality of samples is equal to zero;

in response to a determination that each of the plurality of samples is equal to zero, perform a zero detection process for an entirety of the received data unit; and in response to a determination that at least one of the plurality of samples is not equal to zero, skip performance of the zero detection process for the received data unit.

16. A method comprising:

receiving, by a storage controller of a storage system, a data unit to be stored in a persistent storage of the storage system;

calculating, by the storage controller, a plurality of entropy values for the received data unit, wherein each entropy value of the plurality of entropy values indicates a different entropy characteristic of an entirety of the received data unit, and wherein each entropy value of the plurality of entropy values is calculated using a different type of entropy calculation;

selecting, by the storage controller based on the plurality of entropy values, at least one reduction operation from a plurality of different reduction operations; and performing, by the storage controller, the selected at least one reduction operation on the received data unit.

17. The method of claim 16, wherein:

the plurality of different reduction operations comprises at least one type of data deduplication operation and at least one type of data compression operation, and the plurality of entropy values comprises a minimum entropy value and a maximum entropy value.

18. The method of claim 17, comprising:

comparing the minimum entropy value to a first lower threshold;

comparing the maximum entropy value to a first upper threshold; and in response to a determination that the minimum entropy value is smaller than the first lower threshold, and the maximum entropy value is smaller than the first upper threshold:

performing a data deduplication operation on the received data unit, performing a fast compression operation on the received data unit, and storing a reduced version of the data unit in the persistent storage.

19. The method of claim 16, comprising:

calculating the plurality of entropy values using a look-up table, wherein the look-up table stores a plurality of constants associated with a plurality of index values, and wherein each constant represents a binary logarithm of a different index value.

20. The method of claim 16, comprising:

obtaining a plurality of samples from the received data unit;

performing, based on the plurality of samples, a calculation of the plurality of entropy values;

determining, based on the calculation of the plurality of entropy values, whether each of the plurality of samples is equal to zero;

in response to a determination that each of the plurality of samples is equal to zero, performing a zero detection process for an entirety of the received data unit.

* * * * *